United States Patent
Braun et al.

(10) Patent No.: US 12,210,043 B2
(45) Date of Patent: Jan. 28, 2025

(54) METHOD FOR MONITORING AN ON-BOARD POWER SUPPLY OF A MOTOR VEHICLE

(71) Applicant: Robert Bosch GmbH, Stuttgart (DE)

(72) Inventors: Lars Braun, Saal (DE); Manuel Eder, Weinstadt (DE); Michael Muerken, Karlsruhe (DE)

(73) Assignee: ROBERT BOSCH GMBH, Stuttgart (DE)

( * ) Notice: Subject to any disclaimer, the term of this patent is extended or adjusted under 35 U.S.C. 154(b) by 129 days.

(21) Appl. No.: 18/189,539

(22) Filed: Mar. 24, 2023

(65) Prior Publication Data

US 2023/0366914 A1 Nov. 16, 2023

(30) Foreign Application Priority Data

May 16, 2022 (DE) ...................... 10 2022 204 755.9

(51) Int. Cl.
*G01R 19/00* (2006.01)
*B60R 16/033* (2006.01)
*G01R 19/10* (2006.01)

(52) U.S. Cl.
CPC ........ *G01R 19/0038* (2013.01); *B60R 16/033* (2013.01); *G01R 19/10* (2013.01)

(58) Field of Classification Search
CPC ... B60R 16/02; B60R 16/023; B60R 16/0231; B60R 16/0232; B60R 16/03; B60R 16/033; G01R 19/0038; G01R 19/10
See application file for complete search history.

(56) References Cited

U.S. PATENT DOCUMENTS

2006/0193094 A1* 8/2006 Korsten .................. H04L 12/10
361/62
2015/0094901 A1* 4/2015 Brenneis ................. B60R 21/00
701/1

(Continued)

FOREIGN PATENT DOCUMENTS

DE 102016214112 A1 2/2018
DE 102018212369 A1 1/2020

(Continued)

*Primary Examiner* — Huy Q Phan
*Assistant Examiner* — David B Frederiksen
(74) *Attorney, Agent, or Firm* — NORTON ROSE FULBRIGHT US LLP; Gerard A. Messina

(57) ABSTRACT

A method for monitoring an on-board power supply of a motor vehicle. A power distributor is provided, via which a supply voltage is supplied to a safety-relevant consumer and via which non-safety-relevant consumers are supplied. A disconnection of consumers takes place if at least one measure of the voltage applied at least to the safety-relevant consumer reaches a limit value. After disconnecting consumers, the measure of the voltage applied to the safety-relevant consumer is ascertained. The measure of the voltage applied to the respective safety-relevant consumer is respectively compared to a further limit value for a sufficient voltage. From the disconnected consumers, at least one consumer to be connected is selected, which is connected if the limit value is respectively reached at the safety-relevant consumers. The consumer to be connected is selected as a function of a connection measure such that the connection measure is not exceeded.

14 Claims, 5 Drawing Sheets

(56) References Cited

U.S. PATENT DOCUMENTS

2020/0331497 A1\* 10/2020 Bohne ................ B60W 50/023
2022/0131372 A1\* 4/2022 Iliev ........................ H02M 3/04

FOREIGN PATENT DOCUMENTS

| DE | 102018212777 A1 | 2/2020 |
| DE | 102020212414 A1 | 3/2022 |
| WO | 2015176786 A1 | 11/2015 |

\* cited by examiner

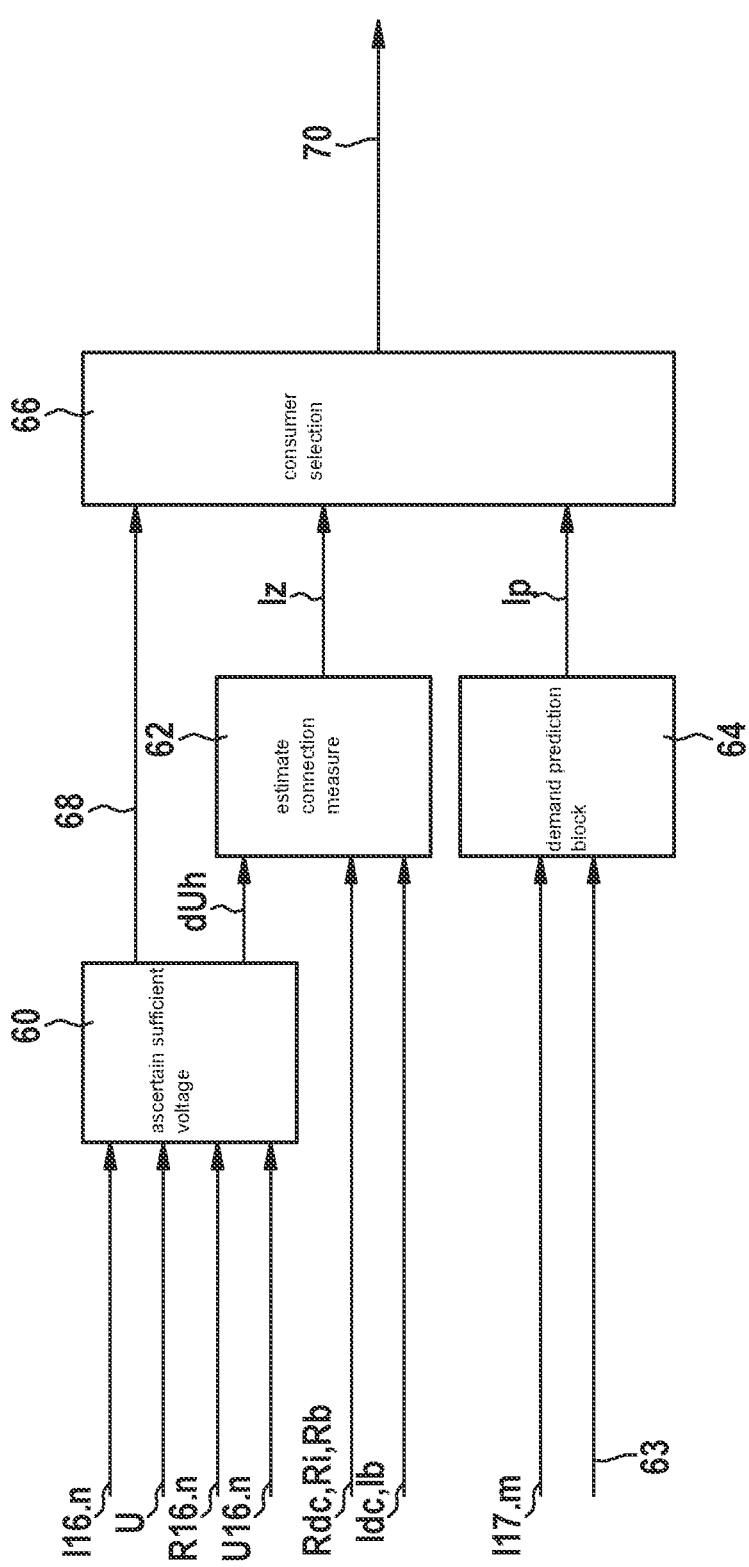

METHOD FOR MONITORING AN ON-BOARD POWER SUPPLY OF A MOTOR VEHICLE

CROSS REFERENCE

The present application claims the benefit under 35 U.S.C. § 119 of German Patent Application No. DE 10 2022 204 755.9 filed on May 16, 2022, which is expressly incorporated herein by reference in its entirety.

FIELD

The present invention relates to a method for monitoring an on-board power supply of a motor vehicle.

BACKGROUND INFORMATION

German Patent Application No. DE 10 2018 212 369 A1 describes a method for monitoring a power supply in a motor vehicle, wherein in a partial on-board power supply, at least one energy store supplies power to a plurality of preferably safety-relevant consumers. At least one measured variable of an energy store and/or of at least one consumer is sensed, wherein at least one cable harness model is provided, which represents the partial on-board power supply. A parameter estimator that estimates at least one characteristic variable of the cable harness model using the measured variables is provided.

A method for monitoring an on-board power supply of a motor vehicle is described in German Patent Application No. DE 10 2018 212 777 A1. Here, it is checked, by means of simulation, which safe-stop scenario is available with the current battery and on-board power supply state. Furthermore, appropriate measures are proposed in the on-board power supply and the analysis of the direct impact of these measures on the availability of the different scenarios is ascertained.

German Patent Application No. DE 10 2020 212 414 A1 describes a method for monitoring an on-board power supply of a motor vehicle, wherein at least one safety-relevant consumer and optionally other consumers are supplied by an energy store, wherein at least one on-board power supply model is provided, which represents the safety-relevant consumer and corresponding lines with associated line resistances and connection to the energy store, comprising the following steps: providing a current profile or power profile, which is expected to be necessary at least for a particular maneuver of the motor vehicle with the participation of the safety-relevant consumer and can optionally include a base load of at least one further consumer; ascertaining a predicted characteristic variable of the energy store using the current profile or power profile; ascertaining a predicted characteristic variable of the safety-relevant consumer using a current profile or power profile, which is expected to be applied to the safety-relevant consumer, the associated line resistance and the predicted characteristic variable of the energy store; evaluating the predicted characteristic variable of the safety-relevant consumer.

An object of the present invention is to further increase the availability with minor loss of comfort, in particular in the case of on-board power supplies with high safety requirements. The object may be achieved by features of the present invention.

SUMMARY

A method according to the present invention may have the advantage that on the one hand, a sufficient voltage supply for safety-relevant consumers can be ensured with high reliability, wherein, due to the more accurate ascertainment of a connection measure, consumers disconnected at an early stage are selectively connected very specifically. The detection of a sufficient voltage at the safety-relevant consumers is used as an input trigger for the connection of, in particular, non-safety-relevant consumers. Consumers can thus be specifically connected if the supply situation at the safety-relevant consumers is sufficient and a sufficient power budget or connection measure is present. A safe state can thus be ascertained, and a safe connection can be performed accordingly without an undervoltage event occurring again. A cascaded connection, as often customary in the prior art, can be omitted, as a result of which a quick connection is possible in a manner adapted to the recovery of the on-board power supply. The connection of the consumers takes place only if the on-board power supply can provide the power demand. This avoids an unstable state characterized by frequent connection and disconnection of the consumers, and the availability of the non-safety-relevant consumers is thereby significantly increased.

In an expedient development of the present invention, demand prediction for ascertaining the predicted demand, in particular current demand, of a disconnected consumer is performed in order to select the consumer to be connected. More accurate predictions can thus be performed regarding the effects of connecting the consumer with a view to the voltage stability in the on-board power supply or at the safety-relevant consumer. Particularly expediently, the consumers to be connected are selected such that the respectively predicted demands of the consumers to be connected in total do not exceed the connection measure. The consumer selection takes place specifically as a function of the predicted demand so that exact and early connection takes place as required. The thereby possible early connection increases the comfort for the user.

In an expedient development of the present invention, it is provided that the connection measure is formed as a function of the measure of the voltage applied to the respective safety-relevant consumer after the disconnection and as a function of the further limit value. It is particularly expediently provided that an extremum, in particular a minimum, is ascertained from the various measures of the voltages applied to the safety-relevant consumers, and that a differential voltage is ascertained from the difference of the minimum and the further limit value, and that the connection measure is ascertained from the differential voltage. From these values, the connection measure that does not lead to a critical voltage limit value at the safety-relevant consumer being fallen below can be ascertained particularly accurately, which increases availability.

In an expedient development of the present invention, it is provided that the predicted demand is ascertained using a previously stored constant value and/or using an actual demand of the disconnected consumer prior to the disconnection and/or using a model for estimating the demand of the respective consumer. Depending on the application, the use of previously stored values that represent the worst case with a view to voltage stability is sufficient, wherein the implementation is simplified. The accuracy can be further increased by using the most recently required demands or by using a prediction model so that a connection may possibly take place sooner due to the more accurate prediction. In this case, the prediction model may continuously self-parameterize, whereby the prediction is improved even further.

In an expedient development of the present invention, the consumers are connected as a function of the amount of the predicted demand; in particular, the consumer with the highest predicted demand is connected first. This makes it particularly simple to define a connection sequence that takes into consideration the comfort of the user.

In an expedient development of the present invention, the consumers to be connected are prioritized differently and connected as a function of the prioritization. Particularly expediently, the predicted demands of the consumers can be assessed with a weighting factor and be connected according to this assessment. Individual comfort estimates of the users can thus be particularly simply taken into account in the selection of the consumers to be connected. Particularly expediently, the consumers can each be provided with a weighting or a priority value, wherein the selection of the respective consumers to be connected is carried out by means of an optimization of the linked weightings or priority values. Using appropriate optimization methods, the best utility value for the user of the vehicle can be ascertained. An optimum between demand and priority can thus be achieved.

In an expedient development of the present invention, a trigger for a connection of the consumers to be connected is generated if all voltages at the respective safety-relevant consumers reach the further limit value. Particularly expediently, the consumers to be connected are connected after a particular time period and/or after a particular number of triggers. This can ensure that the on-board power supply has stabilized sufficiently and that a connection of disconnected consumers does not lead to a critical limit value being fallen below again.

In an expedient development of the present invention, it is provided that the measure of the voltage applied to the safety-relevant consumer is ascertained from the supply voltage at the power distributor and a voltage drop at a line path between the power distributor and the safety-relevant consumer. Especially through taking into account the voltage drop at the line path, a particularly precise and accurate prediction of a possible sufficient voltage can be realized, whereby particular consumers can be connected specifically and according to the demand. The consumers can tend to be connected sooner than this would otherwise take place with the usual, high safety margins.

In an expedient development of the present invention, it is provided that the voltage drop at the line path between the power distributor and the safety-relevant consumer is ascertained using a resistance of the respective line path and the current flowing through the safety-relevant consumer. The corresponding measured variables, in particular the current, are generally already present in the power distributor, for example due to safety functions relating to overcurrent disconnection, or the like, so that a simple ascertainment of the voltage drop at the safety-relevant consumer thereby becomes possible.

In an expedient development of the present invention, the connection measure, in particular the current to be connected, is ascertained as a function of a resistance of a line path connecting the energy store and the power distributor and/or as a function of an internal resistance of the energy store. Again, the accuracy increases since further characteristic variables, which may also change more strongly over the service life of the energy store or of the on-board power supply, are taken into account.

In an expedient development of the present invention, the connection measure is ascertained using a resistance of a line path to the energy store and/or to an alternative power source and/or using an internal resistance of the energy store and/or as a function of a previously defined connection measure and/or as a function of a resistance, ascertained by a model or diagnosis, of a line path to the energy store and/or to an alternative power source and/or as a function of an internal resistance, ascertained by a model or diagnosis, of the energy store. The accuracy can thus be further increased. In particular by drawing on a model or diagnosis, the aging state of the on-board power supply components can be predicted relatively accurately and used as a basis for a corresponding, more accurate ascertainment of the connection measure.

In an expedient development of the present invention, it is provided that the measure of the voltage applied at least to the safety-relevant consumer is ascertained by measuring this voltage at the safety-relevant consumer and/or using a current flowing through the safety-relevant consumer and/or by measuring the supply voltage and/or by taking into account a resistance, in particular a worst-case value of the resistance or a resistance, estimated by a model or a diagnosis, of a line path between the power distributor and the safety-relevant consumer and/or as a function of a worst-case value of a voltage drop at the resistance. On the one hand, the accuracy of the evaluation can be further increased by suitable measures, such as measuring the voltage directly at the safety-relevant consumer or the current flow through the safety-relevant consumer. On the other hand, particular worst-case values can further simplify the ascertainment. By also using a model or diagnosis for the voltage ascertainment at the safety-relevant consumer, the corresponding aging states of the on-board power supply components can be reliably represented.

Particularly expediently, a measure of the voltage applied at least to the safety-relevant consumer is ascertained, wherein an undervoltage at the safety-relevant consumer is ascertained therefrom as a function of a limit value, wherein a reduction measure of a disconnection or degradation of at least one non-safety-relevant consumer required to increase the voltage applied to the safety-relevant consumer is ascertained as a function of the undervoltage and is used to select the non-safety-relevant consumer to be disconnected or to be degraded. The disconnection of the consumers preceding the connection can thus be carried out in a particularly purposeful manner.

Further expedient developments of the present invention arise from the disclosure herein.

BRIEF DESCRIPTION OF THE DRAWINGS

FIG. 5 shows a block diagram for realizing the various partial methods for connecting consumers, according to an example embodiment of the present invention.

DETAILED DESCRIPTION OF EXAMPLE EMBODIMENTS

The present invention is shown schematically on the basis of an exemplary embodiment and is extensively described below with reference to the figures.

Figure 1:
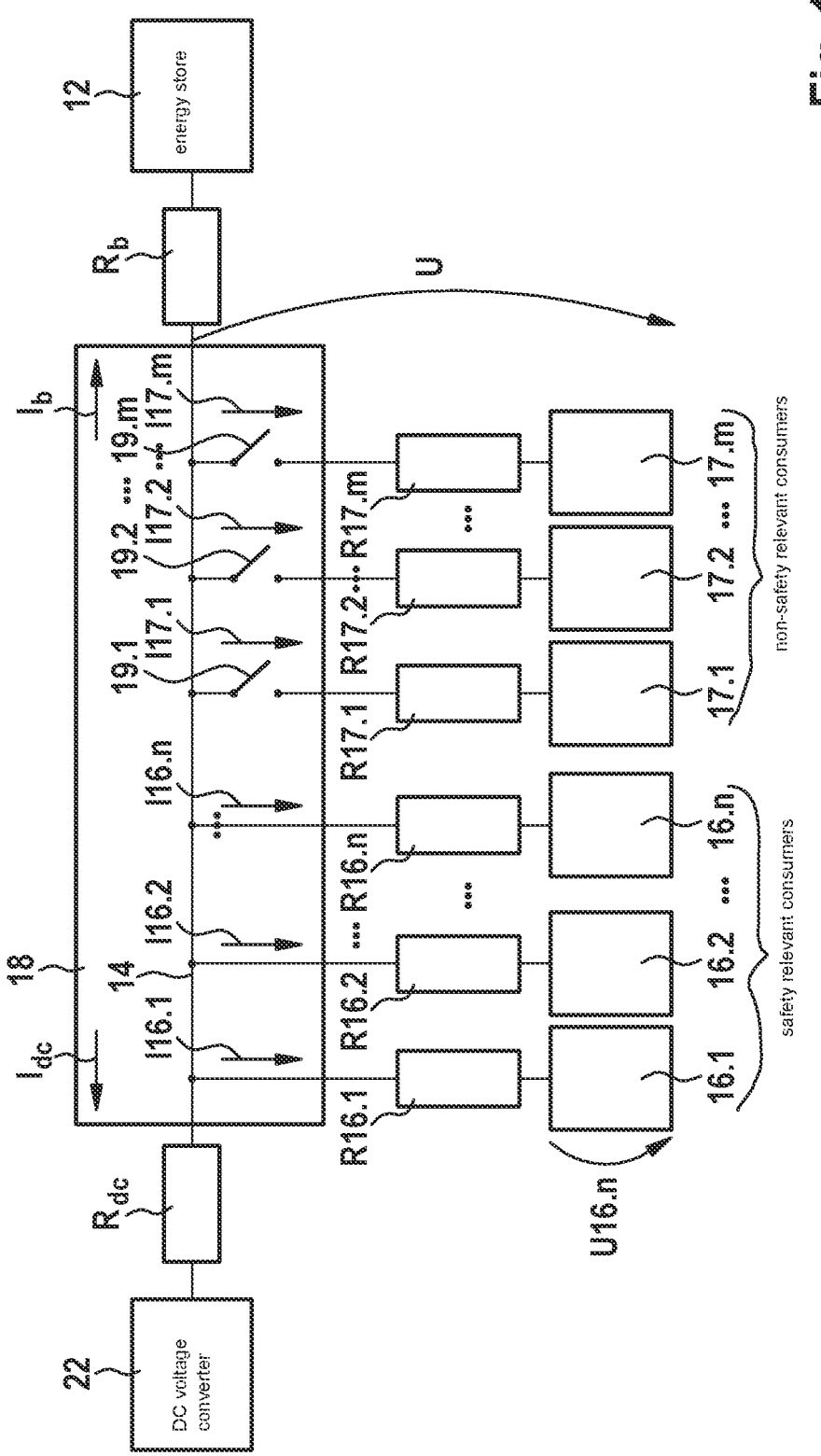
FIG. 1 shows an on-board power supply comprising a power distributor, according to an example embodiment of the present invention.

FIG. 1 shows a partial on-board power supply, in particular in a motor vehicle, which comprises a power distributor 18. The power distributor 18 is supplied with power by an energy store 12, in particular a battery. For this purpose, the energy store 12 is connected to a bus bar 14, which extends at least partially in the power distributor 18. A resistance Rb is indicated between the power distributor 18 and the energy store 12 and represents the resistance in the supply line to the energy store 12, in particular the battery. In order to provide a possibly redundant supply of the power distributor 18, the bus bar 14 of the power distributor 18 can be connected to a further power supply at the other input, indicated in the exemplary embodiment through the provision of a DC voltage converter 22. The DC voltage converter 22 establishes the connection to a further partial on-board power supply, which may, for example, have a higher or lower or similar voltage level. Again, a resistance Rdc is schematically indicated between the power distributor 18 and the DC voltage converter 22 and represents the resistance in the supply line from the power distributor 18 to the DC voltage converter 22.

Connected to the power distributor 18 are n safety-relevant consumers 16.1, 16.2, . . . , 16.$n$ and m non-safety-relevant consumers 17.1, 17.2, . . . 17.$m$. The safety-relevant consumers 16.$n$ can be particularly protected, for example against overcurrents, by switching means (i.e., switches) not shown for reasons of clarity. The non-safety-relevant consumers 17.$m$ can be controlled, in particular disconnected or degraded, by respective switching means (i.e., switches) 19 (19.1,19.2, . . . , 19.$m$). These switching means 19 are arranged in the power distributor 18. The switching means 19 are preferably semiconductor switches, such as Mosfets, etc. In the power distributor 18, the voltage U is measured at the bus bar 14. Furthermore, a current measurement is provided in the power distributor 18. In the exemplary embodiment, each current I16.$n$ flowing through the respective safety-relevant consumer 16.$n$ is sensed. Optionally, each current I17.$m$ flowing through the respective non-safety-relevant consumer 17.$m$ can be sensed. Optionally, the respective voltage U16.$n$ applied to the respective safety-relevant consumer 16.$n$ can be measured, in particular with respect to earth or ground GND. Depending on the location of the evaluation, the ascertained or measured applied voltage U16.$n$ can, for example, also be transmitted to the power distributor 18 or other control devices via a communication system, for example a bus system, such as a CAN bus, or the like. Alternatively, the evaluation could be carried out in the safety-relevant consumer 16.$n$ itself.

A respective resistance R16.1, R16.2, . . . , R16.$n$ is shown between the power distributor 18 and the respective safety-relevant consumer 16.$n$ and represents the resistance of the respective line path between the power distributor 18 and the respective consumer 16.$n$. A respective resistance R17.1, R17.2, . . . , R17.$m$ is shown between the power distributor 18 and the respective non-safety-relevant consumer 17.$m$ and represents the resistance of the respective line path between the power distributor 18 and the respective non-safety-relevant consumer 17.$m$.

A sensor, preferably a battery sensor, not shown could be provided at the energy store 12 in order to sense further characteristic variables of the energy store 12. In this sensor, corresponding characteristic variables of the energy store 12, such as the internal resistance Ri, the state of charge SOC, or the like, could be ascertained on the basis of the state variables of the energy store 12 and an associated model, for example. The safety-relevant consumers 16 are special consumers with high requirements or a high need for protection, generally referred to as safety-relevant consumers 16. For example, an electric steering and/or a brake system are examples of such components that must absolutely be supplied in order to ensure steering and/or braking of the vehicle in the event of a fault.

The power distributor 18 likewise has corresponding processing means not shown in more detail, such as a microcontroller, for storing or evaluating sensed variables. In addition, the microcontroller is able to control corresponding switching means 19 (or the switching means not shown for the safety-relevant consumers 16 for the protection of the same). Alternatively, the evaluation could also take place in another control device.

The consumers 16 supplied by the power distributor 18 could include, for example, safety-relevant vehicle functions, such as braking, steering, etc., in particular consumers 16 with high requirements with regard to the need for protection. In general, safety-relevant consumers 16 are consumers that are particularly worthy of protection, which are, for example, necessary to maintain certain emergency functions. In addition to the described functions, such as steering and braking, these functions may also be functions that, for example, should still be functional after an accident if possible, such as restraint systems, locking systems for opening and locking the vehicle doors, emergency call systems, for example for placing an electronic emergency call, sliding roof functions, lighting, or the like.

The non-safety-relevant consumptions 17.$m$ are typically comfort consumers. Comfort consumers 17.$m$ may be divided into main groups and sub-groups depending on the applications and thus be grouped (cf. the alternative exemplary embodiment according to FIG. 2 with the further distributors 50, 52). These are consumers 17 that are not characterized by high safety relevance or are characterized by lower requirements with regard to a need for protection.

Figure 2:
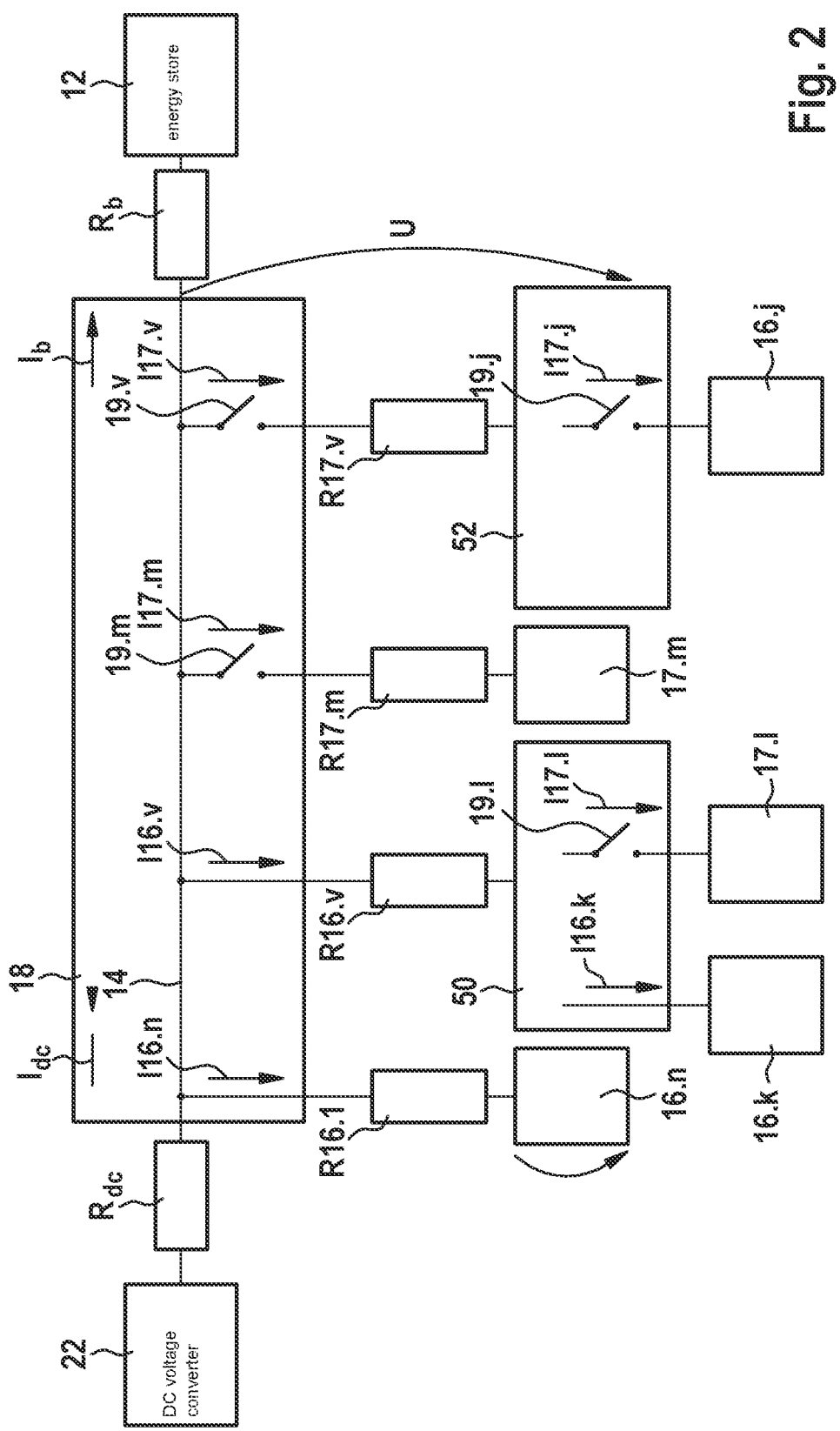
FIG. 2 shows an alternative exemplary embodiment of an on-board power supply comprising a power distributor and further distributor, according to the present invention.

The exemplary embodiment according to FIG. 2 differs from that according to FIG. 1 in that the power distributor 18 is connected to further distributors 50, 52, via which further consumers 16.$k$, 17.1, 17.$j$ shown, by way of example, can respectively be controlled. The distributor 50, to which at least one safety-relevant consumer 16.$k$ is connected, is supplied by the power distributor 18 with a corresponding current I16.$v$ via a line with a line resistance R16.$v$. In addition, a further distributor 52 is provided, via which only non-safety-relevant consumers 17.$j$, only a single exemplary consumer being shown in the exemplary embodiment, can be supplied and disconnected via the corresponding switching means 19.$j$. The further distributor 52 is supplied by the power distributor 18 with a corresponding current I17.$v$ via a line with a line resistance R17.$v$. The associated non-safety-relevant consumer 17.$j$ is supplied with a current I17.$j$.

The partial methods described below can be distributed to different control devices. Thus, a disconnection and/or a connection of the non-safety-relevant consumers 17.$m$ can also be triggered in other distributors 50, 52 via the corresponding switching means 19.1, 19.$j$. The signal 40, 70 for disconnecting or connecting the consumers 17.1, 17.$j$ could be transmitted via a communication bus and also be commanded in a separate control device, such as a so-called vehicle computer. If an undervoltage dU is applied to a safety-relevant consumer 16.$k$, which in turn is supplied by the distributor 50, this distributor 50 can also initiate a disconnection of corresponding non-safety-relevant consumers 17 to the power distributor 18.

In the exemplary embodiment, a battery or accumulator is described as a possible energy store 12 by way of example.

However, alternatively, other energy stores, for example on an inductive or capacitive basis, fuel cells, capacitors, or the like, suitable for this task can be used equally.

The time range of the disconnection of the consumers 17 to be disconnected is in the order of magnitude of between 1 ms and 500 ms. The method is not used for the protection of lines, components or parts and is therefore not comparable to the overcurrent disconnection in the time range of less than 10 μs.

In the traditional on-board power supply, control interventions by the energy management are to be expected in the time range greater than 500 ms. Optionally, it must be ensured that the variables to be evaluated are sensed quickly and/or transmitted quickly to the evaluation unit, for example the power distributor 18.

Figure 3:
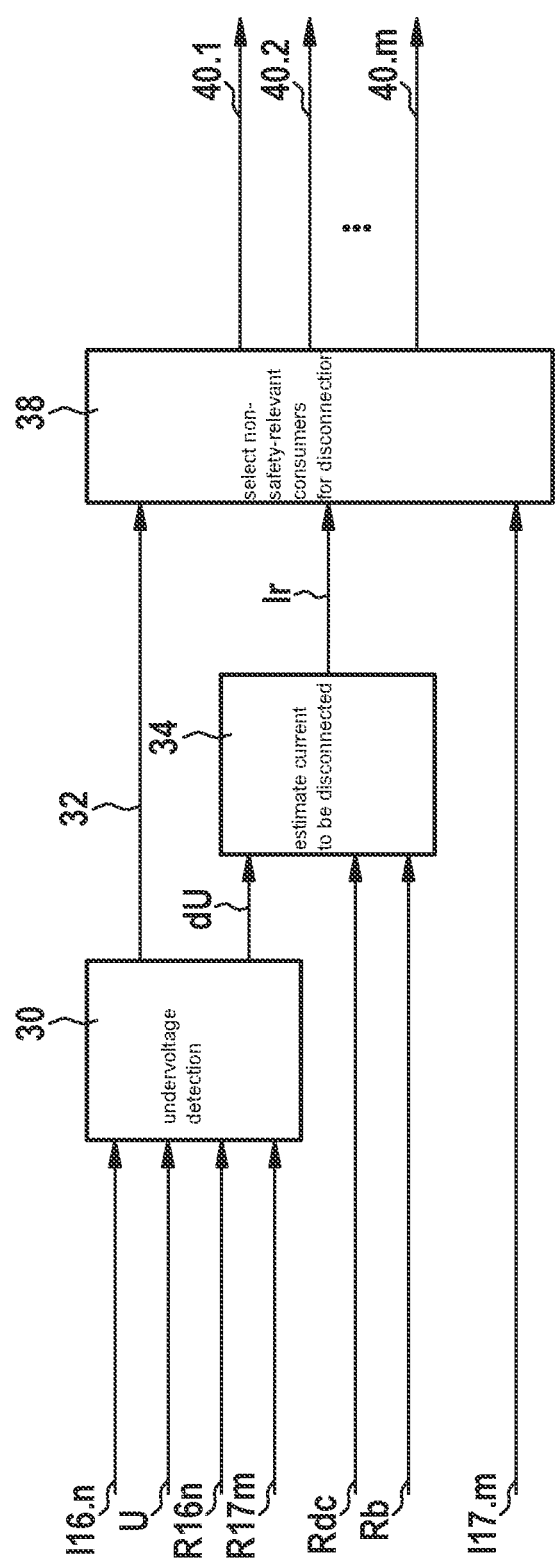
FIG. 3 shows a block diagram for realizing the various partial methods for disconnecting consumers, according to an example embodiment of the present invention.

In FIG. 3, the various blocks 30, 34, 38 with input and output variables are shown schematically. A plurality of the above-described variables is fed to an undervoltage detection 30. These are the currents I16.$n$ by the respective safety-relevant consumers 16.$n$ and/or the voltage U at the bus bar 14 and/or the respective resistance(s) R16.$n$ of the respective line path to the respective safety-relevant consumer 16.$n$ and/or the respective resistances R17.$m$ of the respective line path to the respective non-safety-relevant consumer 17.$m$. The undervoltage detection 30 ascertains therefrom at least one trigger 32 and/or the undervoltage dU as described below. The calculation of the undervoltage detection 30 can take place in the power distributor 18 or else in the respective consumer 16.$n$, 17.$m$, in particular in the safety-relevant consumer 16.$n$, but also in a non-safety-relevant consumer 17.$m$. For the undervoltage detection 30, the following method steps can be used individually or in combination. A measure of the voltage U16.$n$ at the respective safety-relevant consumer 16.$n$ can be ascertained via different approaches as follows.

In a first alternative, the voltage U is sensed at the bus bar 14. A predefined voltage Uw, which represents the worst case, is subtracted from the voltage U at the bus bar 14 in order to take into account the voltage drop across the respective resistance R16.$n$ of the line path to the respective safety-relevant consumer 16.$n$. This predefined voltage Uw represents a worst-case experience value, which must be expected at the worst. The voltage U16.$n$ at the respective safety-relevant consumer 16.$n$ can thus be estimated as follows:

$$U16.n = U - Uw \quad (1)$$

In a further alternative, the measured voltage U at the bus bar 14, the measured currents I16.$n$ through the safety-relevant consumers 16.$n$ as well as a fixed resistance value R16.$n$_w representing the worst case are used to estimate the measure of the voltage drop U16.$n$ at the safety-relevant consumer 16.$n$. From the voltage U at the bus bar 14, the voltage drop across the line path is calculated by a worst-case estimate of the line resistance R16.$n$_w and the current flow I16.$n$ through the respective lines according to Ohm's law:

$$U16.n = U - I16.n * R16.n\_w \quad (2)$$

In a further alternative, the measured voltage U at the bus bar 14, the measured currents I16.$n$ through the safety-relevant consumers 16.$n$ and a respective line resistance R16.$n$_d estimated within the framework of a model are used to estimate the measure of the voltage drop U16.$n$ at the safety-relevant consumer 16.$n$. From the voltage U at the bus bar 14, the voltage drop across the line path is calculated using a diagnostic function (e.g., as described in German Patent Application No. DE 10 2018 212 369 A1, and reference is made to the disclosure thereof in its entirety) of the line resistance R16.$n$_d and the current flow I16.$n$ through these lines:

$$U16.n = U - I16.n * R16.n\_d \quad (3)$$

In a further alternative exemplary embodiment, the voltage U16.$n$ applied to the safety-relevant consumers 16.$n$ is measured directly in the respective consumer 16.$n$ itself and is communicated to the power distributor 18 via a communication interface (e.g., CAN):

$$U16.n = U16.n \text{ via communication means} \quad (4)$$

In a further alternative, a measure of the applied voltage U16.$n$ at the safety-relevant consumer 16.$n$ can be evaluated in the respective consumer 16.$n$ itself. If an impending undervoltage dU is detected, the function integrated in the respective consumer 16 sends a trigger 34 and/or an undervoltage dU to the power distributor 18. The undervoltage detection 30 is thus carried out in the consumer 16.$n$ instead of in the power distributor 18:

$$U16.n = U16.n \text{ in the consumer 16} \quad (5)$$

The different ways of ascertaining the measure of the voltage U16.$n$ applied to the safety-relevant consumer 16.$n$ could be used either alternatively (individually) or for mutual plausibility verification using at least two, but also a plurality of alternative ascertainment options. In the event of implausible results, appropriate warnings or countermeasures can be initiated.

Figure 4:
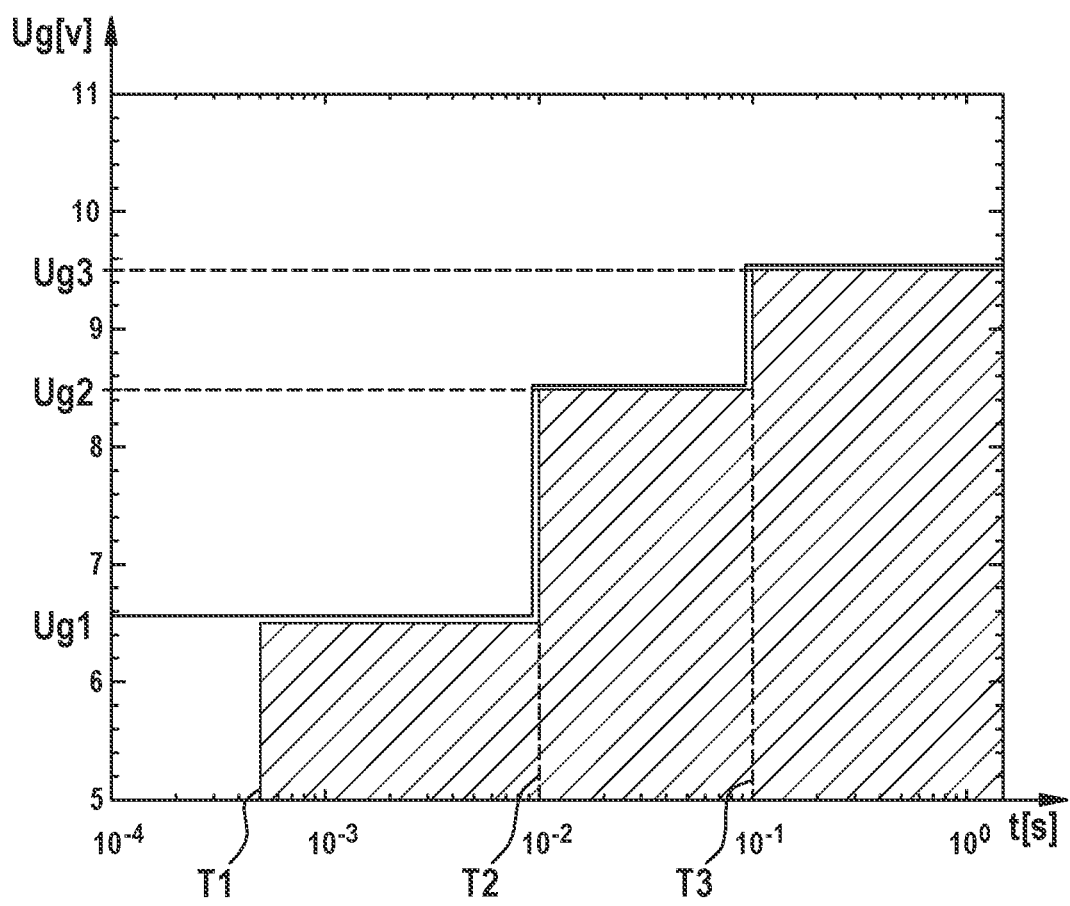
FIG. 4 shows an exemplary voltage-time diagram with associated undervoltage ranges, according to the present invention.

The duration T1, T2, T3 of the applied calculated or measured voltage U16.$n$ is decisive in order to detect an impending undervoltage dU and to generate a trigger signal 32, which initiates the disconnection 40 or degradation of non-safety-relevant consumers 17. According to FIG. 4, this is represented via a dynamic voltage limit Ug. The voltage limit Ug thus increases as the duration T of the voltage limit Ug being fallen below increases. In the exemplary embodiment according to FIG. 4, the increase of the voltage limit Ug takes place stepwise as the duration T increases. In principle, however, other relationships between the limit value Ug and the maximum permitted time span T for the respective limit value Ug could also be implemented in the form of a continuous or continuously increasing function. The time period T or T1, T2, T3 indicates the maximum duration within which the voltage U16.$n$ of the safety-relevant consumer 16.$n$ must not fall below the associated limit value Ug or Ug1, Ug2, Ug3, otherwise there is a risk of undersupply or failure of the safety-relevant consumer 16.$n$. From a time period T1, the limit value Ug has a first value Ug1, which remains constant until a further time period T2. The time period T1 is, for example, in the range around 0.5 ms, the further time period T2 is 10 ms, for example. The first limit value Ug1 has the lowest value; for example, with respect to the supply voltage (in the exemplary embodiment 12V), it assumes a value around 50% with respect to the supply voltage. In terms of absolute values, the first limit value Ug1 is in a range of, for example, 6V and 7V; in the exemplary embodiment, it is 6.4V.

From the time period T2 (e.g., 10 ms), the limit value Ug increases to a value of Ug2 of 70% with respect to the supply voltage; in terms of absolute values, as shown by way of example in FIG. 3, to 8.6 V or a range of between 8 and 9 V, for example. From the time period T2, the second limit value Ug2 remains constant until a time period of T3. From a time period T3 (e.g., 100 ms), the limit value Ug increases to a value of Ug3 of 80% with respect to the supply voltage;

in terms of absolute values, as shown by way of example in FIG. 3, to 9.6 V or a range of between 9 and 10 V. From the time period T3, the third limit value Ug3 again remains constant.

If there is a risk of the ascertained voltage U16.$n$ falling below the first limit value Ug1 for the time period T1, a trigger 32 is generated. If there is a risk of the ascertained voltage U16.$n$ falling below the second limit value Ug2 for the time period T2, the trigger 32 is generated. If there is a risk of the ascertained voltage U16.$n$ falling below the third limit value Ug3 for the time period T3, the trigger 32 is generated. If the ascertained voltage U16.$n$ falls below one of the limit values Ug, a timer is started at this time. As soon as the time period T associated with the fallen-below limit value Ug is reached, the trigger 32 is generated. With respect to this fallen-below limit value Ug, the undervoltage dU is ascertained as described below.

Using the ascertained or measured voltage U16.$n$ at the respective safety-relevant consumer 16.$n$ and the dynamic voltage limit Ug; Ug1, Ug2, Ug3, for example according to FIG. 3, the differential voltage or undervoltage dU is calculated: dU=Ug−U16.$n$, wherein the limit value Ug that is closest to the ascertained voltage drop U16.$n$ at the safety-relevant consumer 16.$n$ is selected. For example, if the voltage U16.$n$ is 6V, the undervoltage dU to the closest limit value Ug1 (Ug1=6.4V) is 0.4V. If the voltage U16.$n$ is, for example, 8 V, the undervoltage dU to the closest limit value Ug2 (Ug2=8.6V) is 0.6 V, etc.

The differential voltage or undervoltage dU is used as the input variable for a block 34 for estimating the current Ir to be disconnected.

The method step or block 34 for estimating the reduction measure, such as the current Ir to be disconnected or reduced, is described in more detail below. In order to stabilize the voltage U (increase by dU) and to comply with the voltage and time limits of the safety-relevant consumers 16.$n$, a disconnection of one or more non-safety-relevant consumers 17.$m$ is necessary. How many of the non-safety-relevant consumers 17.$m$ must be disconnected is decided on the basis of the reduction measure Ir (e.g., current 36 to be disconnected). How high the current Ir to be reduced must be in order to increase the supply voltage U by dU can be derived via one of the partial methods described below.

For example, a fixed value of the reduction measure or current Ir to be disconnected could be implemented as a possible alternative. When triggering the trigger 32, the current Ir defined here must be disconnected:

$$Ir=\text{constant} \quad (1)$$

In a further alternative, the reduction measure Ir is calculated using the undervoltage dU ascertained by the undervoltage detection 30, the total resistance Rb of the entire path from the energy store 12 to the input of the power distributor 18, the resistance Ri for the internal resistance of the energy store 12, in particular the battery, to the earth or ground. The mentioned resistances Rb, Ri could be based on the known resistances at the beginning of the service life or else corresponding estimates. If the energy store 12 is not available as a source or if the energy store 12 is being charged, the current toward the DC voltage converter 22 must be reduced. The reducing current Ir is thus determined as follows:

$$Ir=dU/(Rb+Ri) \text{ or } Ir=dU/Rdc \quad (2)$$

In a further alternative procedure, the reduction measure, such as the current Ir to be disconnected, is calculated using the undervoltage dU calculated by the undervoltage detection 30, the resistance Rdc_d, determined by diagnosis, of the line set of the supply line from the DC voltage converter 22 and/or the resistance Rb_d, determined by diagnosis, of the line set of the supply line to the energy store 12 and/or the internal resistance Ri_d, determined by diagnosis, of the energy store 12:

$$Ir=dU/(Rb\_d+Ri\_d) \text{ or } Ir=dU/Rdc\_d \quad (3)$$

In a further alternative, a reduction measure Ir can also be specified by the energy management in order to stabilize the voltage accordingly:

$$Ir=Ir \text{ via communication system from the energy management} \quad (4)$$

A further block 38 is used to select the non-safety-relevant consumers 17.$m$ for disconnection. For this method step 38, the trigger 32 and/or the current Ir to be disconnected from block 34 and/or the respective currents I17.$m$ flowing through the respective non-safety-relevant consumers 17.$m$ are supplied. Thus, if the trigger 32 (from block 30) and the current Ir to be disconnected (from block 34) are known, one of the method steps described below is used to specifically disconnect particular non-safety-relevant consumers 17.$m$. The disconnection takes place via corresponding disconnection signals 40.1, 40.2, ..., 40.$m$, via which the respective switching means 19$m$ concerned can be controlled. The consumers 17.$m$ can be disconnected directly or in a plurality of stages. In the case of step-wise disconnection, a defined system response is awaited after a consumer (group) disconnection, and if necessary or in case of non-compliance with the voltage requirements, a new or further disconnection of the non-safety-relevant consumers 17.$m$ is carried out. A system response could be an increase in voltage at the bus bar U or a signal from a superordinate system.

In one variant, all non-safety-relevant consumers 17.$m$ can be disconnected. If a corresponding trigger signal 36 is generated and transmitted by the undervoltage detection 30, all non-safety-relevant consumers 17.$m$ are disconnected. The current Ir to be reduced is not necessary as the input variable.

A further alternative variant proceeds according to the criterion of the maximum current flowing in the respective non-safety-relevant consumers 17.$m$ at that moment. Thus, the non-safety-relevant consumer 17.$m$max with the maximum current flow I17.$m$max is initially disconnected. This takes place until the current Ir to be reduced is reached.

In a further alternative variant, the current I17.$m$ flowing through the non-safety-relevant consumers 17.$m$ can be multiplied by a constant or dynamic weighting factor and disconnection can take place according to this weighting score until the current Ir to be reduced is at least reached. The weighting score may also be independent of the current I17.$m$. Using the weighting, the optimal consumers 17.$m$ can be disconnected in order to find an optimum between the current Ir to be disconnected and the loss of the function of the respective non-safety-relevant consumer 17.$m$. Weighting methods that are based on static or dynamic values or on the current or state of the on-board power supply components can be used for this purpose. In this case, the non-safety-relevant consumers 17.$m$ to be disconnected or to be degraded can, for example, be selected using an optimization method (e.g., optimization problem: binary linear programming). In so doing, each consumer path is assigned a weighting which weights the influence of the current I17.$m$ in the respective consumer path on the system. On the one hand, the condition that the sum of the currents (I17.$m$) of the disconnected consumers 17.$m$ at least reaches the reduction measure Ir must be met. As an optimization goal of an optimized consumer disconnection, the minimum of the sum of the priority values of the non-safety-relevant consumers 17.m (the higher the prioritization of the non-safety-relevant consumer 17.m, the higher the corresponding priority value) can, for example, be used while necessarily complying with the above reduction condition.

In a further alternative variant, the superordinate vehicle system regularly provides a group of disconnectable consumers 17.m. These consumers are then disconnected when the function is carried out. Alternatively, a corresponding grouping of the consumers 17.m may also be disconnected.

The disconnected non-safety-relevant consumers 17.m must be re-connected according to particular criteria. Different criteria may be used in this respect.

The detection of a sufficient voltage Uh at the safety-relevant consumers 16.n is essential. The detection of a sufficient voltage Uh is used as an input trigger 68 for the connection of non-safety-relevant consumers 17.m. Which non-safety-relevant consumers 17.m are connected is decided on the basis of the methods described below. For the detection of the sufficient voltage Uh and the decision as to which non-safety-relevant consumer 17.m is disconnected first, corresponding software functions are developed as an optimal measure of the connection of the most important consumers 17.m.

Non-safety-relevant consumers 17.m are then re-connected if the supply situation at the safety-relevant consumers 16.n is sufficiently good and/or the still existing power budget or power reserve and/or the consumer power after the connection is known.

A safe state can thus be ascertained, and a safe connection can be performed accordingly without an undervoltage dU occurring again. A rapid recovery of the on-board power supply state can thus be achieved due to a rapid connection.

The connection of the non-safety-relevant consumers 17.m takes place only if the on-board power supply can provide the power demand. The supply of the connected consumer 17.m and the stability of the power supply are thus ensured. This avoids frequent connection and disconnection of non-safety-relevant consumers 17.m, whereby availability is significantly increased. This takes place while complying with high requirements for voltage stability and thus security of supply of safety-relevant consumers 16.n.

The consumers 17.m may be connected according to their dynamic priority, customer experience, or other criteria. The connection takes place selectively so that consumers 17.m are selected by means of a prioritization or mathematical methods. Influencing factors, such as the already disconnected duration, or states, such as the interior temperature, etc., can thus be used for additional prioritization.

In FIG. 5, the various blocks 60, 62, 64, 66 with input and output variables are shown schematically. An ascertainment 60 of the sufficient voltage Uh is fed a plurality of the variables described above. These are the currents I16.n through the respective safety-relevant consumers 16.n and/or the voltage U at the bus bar 14 and/or the respective voltages U16.n at the respective safety-relevant consumers 16.n.

Therefrom, the ascertainment 60 determines at least the sufficient voltage Uh as described below. The sufficient voltage Uh indicates that voltage U16.n at the respective safety-relevant consumer 16.n at which the voltage U16.n at the respective safety-relevant consumer has stabilized to a sufficient value so that a connection of further non-safety-relevant consumers 17.m that were previously disconnected when there was a risk of undervoltage dU can take place.

The calculation of the sufficient voltage Uh or the respective voltage U16.n at the respective safety-relevant consumer 16.n can take place in the power distributor 18 or else in the respective consumer 16.n, 17.m, in particular in the safety-relevant consumer 16.n, but also in a non-safety-relevant consumer 17.m. In order to ascertain the sufficient voltage Uh, the following method steps can be used individually or in combination. A measure of the sufficient voltage Uh at the respective safety-relevant consumer 16.n can be ascertained via different approaches as follows.

In a first alternative, the voltage U is sensed at the bus bar 14. A predefined voltage Uw, which represents the worst case, is subtracted from the voltage U at the bus bar 14 in order to take into account the voltage drop across the respective resistance R16.n of the line path to the respective safety-relevant consumer 16.n. This predefined voltage Uw represents a worst-case experience value, which must be expected at the worst. The voltage U16.n at the respective safety-relevant consumer 16.n can thus be estimated as follows:

$$U16.n = U - Uw \quad (1)$$

In a further alternative, the measured voltage U at the bus bar 14, the measured currents I16.n through the safety-relevant consumers 16.n as well as a fixed resistance value R16.n_w representing the worst case are used to estimate the measure of the voltage drop U16.n at the safety-relevant consumer 16.n. From the voltage U at the bus bar 14, the voltage drop across the line path is calculated by a worst-case estimate of the line resistance R16.n_w and the current flow I16.n through the respective lines according to Ohm's law:

$$U16.n = U - I16.n * R16.n\_w \quad (2)$$

In a further alternative, the measured voltage U at the bus bar 14, the measured currents I16.n through the safety-relevant consumers 16.n and a respective line resistance R16.n_d estimated within the framework of a model are used to estimate the measure of the voltage drop U16.n at the safety-relevant consumer 16.n. From the voltage U at the bus bar 14, the voltage drop across the line path is calculated using a diagnostic function (e.g., as described in German Patent Application No. DE 10 2018 212 369 A1, and reference is made to the disclosure thereof in its entirety) of the line resistance R16.n_d and the current flow I16.n through these lines:

$$U16.n = U - I16.n * R16.n\_d \quad (3)$$

In a further alternative exemplary embodiment, the voltage U16.n applied to the safety-relevant consumers 16.n is measured directly in the respective consumer 16.n itself and is communicated to the power distributor 18 via a communication interface (e.g., CAN):

$$U16.n = U16.n \text{ via communication means} \quad (4)$$

In a further alternative, a measure of the applied voltage U16.n at the safety-relevant consumer 16.n can be evaluated in the respective consumer 16.n itself. If an impending undervoltage dU is detected, the function integrated in the respective consumer 16 sends a trigger 34 and/or an undervoltage dU to the power distributor 18. The undervoltage detection 30 is thus carried out in the consumer 16.n instead of in the power distributor 18:

$$U16.n = U16.n \text{ in the consumer 16} \quad (5)$$

The different ways of ascertaining the measure of the voltage U16.n applied to the safety-relevant consumer 16.n could be used either alternatively (individually) or for mutual plausibility verification using at least two, but also a plurality of alternative ascertainment options. In the event of implausible results, appropriate warnings or countermeasures can be initiated.

If the ascertained voltage U16.$n$ reaches a further limit value Ugh (with Ugh>Ug3; e.g., 9.5 V) defining the sufficient voltage Uh, a trigger 68 is generated and/or a differential voltage dUh is calculated. In this case, the ascertained voltage U16.$n$ is the sufficient voltage Uh at which, in principle, a connection of disconnected consumers 17.$m$ is possible. The differential voltage dUh consists of the difference between the further voltage limit value Ugh and the lowest voltage min(U16.$n$) at the safety-relevant consumers U16.$n$ as previously ascertained in one of the steps $$dUh = Ugh - \min(U16.n)$$

The method step or block 62 for estimating the connection measure Iz, e.g., the current Iz to be connected, is described in more detail below. In order to be able to reliably perform the connection of non-safety-relevant (previously disconnected) consumers 17.$m$, the differential voltage dUh is used to calculate the connection measure Iz. As described below, there are different partial methods.

For example, a fixed value of the connection measure or current Iz to be connected could be implemented as a possible alternative. When triggering the trigger 68, there is the possibility of connecting this defined current Iz:

$$Iz = \text{constant} \tag{1}$$

In a further alternative, the connection measure Iz is calculated using the differential voltage dUh calculated in the above partial method, the total resistance Rb of the entire path from the energy store 12 to the input of the power distributor 18, the resistance Ri for the internal resistance of the energy store 12, in particular the battery, to the earth or ground The mentioned resistances Rb, Ri could be based on the known resistances at the beginning of the service life or else corresponding estimates. If the energy store 12 is not available as a source or if the energy store 12 is being charged, the current toward the DC voltage converter 22 must be considered for the connection. The current Iz to be connected is thus determined as follows:

$$Iz = dUh/(Rb+Ri) \text{ or } Ir = dUh/Rdc \tag{2}$$

In a further alternative procedure, the connection measure Iz, such as the current Iz to be connected, is calculated using the undervoltage dUh calculated by the ascertainment 60 of the sufficient voltage Uh, the resistance Rdc_d, determined by diagnosis, of the line set of the supply line from the DC voltage converter 22 and/or the resistance Rb_d, determined by diagnosis, of the line set of the supply line to the energy store 12 and/or the internal resistance Ri_d, determined by diagnosis, of the energy store 12:

$$Iz = dUh/(Rb\_d+Ri\_d) \text{ or } Iz = dUh/Rdc\_d \tag{3}$$

In a further alternative, the connection measure Iz can also be specified by a superordinate vehicle system, such as the energy management, in order to connect the disconnected non-safety-relevant consumers 17.$m$ as a function of the connection measure Iz:

$$Iz = Iz \text{ via communication system from a superordinate vehicle system (e.g., energy management)} \tag{4}$$

Before a non-safety-relevant consumer 17.$m$ can be connected, a prediction must be performed in order to estimate the predicted demand Ip, such as the current demand of the respective disconnected (and possibly to be re-connected) non-safety-relevant consumer 17.$m$. This takes place in the demand prediction block 64 for predicting the consumer current demand Ip. As input variables, the currents I17.$m$ and/or information 63 regarding the disconnected non-safety-relevant consumers 17.$m$ may be fed to the demand prediction 64. Again, different partial methods can ascertain the predicted demand Ip.

The respectively predicted demand, such as the predicted current Ip.m of the individual non-safety-relevant consumers 17.$m$, is assumed to be constant. This constant value may be based on worst-case assumptions associated with the respective consumer 17.$m$ based on experience values or other specifications:

$$Ip = \text{constant} \tag{1}$$

In an alternative method, the expected current or predicted (current) demand Ip is selected depending on the current demand I17.$m$ of the non-relevant consumer 17.$m$ prior to the disconnection. Optionally, this value can be adjusted by means of a factor.

$$Ip = \text{last current demand prior to disconnection} \tag{2}$$

In a further alternative method, the expected or predicted demand Ip, in particular current demand, is ascertained by a corresponding model. For example, the model takes into account the interior temperature, the engine temperature, or further parameters as input variables. The corresponding model can thus be permanently adjusted on the basis of different parameters.

$$Ip = \text{model-based current demand} \tag{3}$$

In a further block 66, the consumer selection 66 takes place. Used as input variables of the consumer selection 66 are the trigger 68 as ascertained by the ascertainment 60 of the sufficient voltage Uh, the connection measure Iz as ascertained by the estimation 62, and the predicted current demand Ip as provided by the demand prediction 64. Furthermore, the disconnected consumers 17.$m$ are known, which are available for the connection. Depending on these variables, the consumer selection 66 for selecting the non-safety-relevant consumer(s) 17.$m$ to be connected takes place via the corresponding connection signal 70. Different procedures may be implemented in this respect.

In a first alternative for ascertaining the connection signal 70, all consumers 17.$m$ can be connected when the trigger 68 is received. The connection signal 70 is generated for all disconnected non-safety-relevant consumers 17.$m$.

In a further alternative for ascertaining the connection signal 70, the non-safety-relevant consumers 17.$m$ with the highest expected current demand Ip as ascertained in the demand prediction 64 are connected first.

In a further alternative for ascertaining the connection signal 70, the non-safety-relevant consumers 17.$m$ can be prioritized differently. The corresponding priority is used when connecting non-safety-relevant consumers 17.$m$. This priority may be static or may be dynamically adjusted.

In a further alternative for ascertaining the connection signal 70, the respective currents Ip to be connected may be assessed with a weighting factor. According to this assessment, the consumers 17.$m$ are selected for connection.

The consumer selection 66 may accordingly support an optimization method. An optimum between the current demand Ip and the priority can thus always be taken into account.

Additionally, the connection may also be triggered only after a particular duration or a particular number of triggers 66 generated by the ascertainment 60 of a sufficient voltage Uh for the connection, in order to provide a time period between the disconnection and the connection.

Furthermore, additional factors may be necessary, such as a voltage limit U1 at the bus bar 14. In this case, communication with the superordinate vehicle system (for example, energy management) is useful, which may block the connection due to a fault in the on-board power system or other system-related influencing variables. The release of all relevant power distributors 18, 50, 52 is also useful in order to exclude a connection in the event of a fault.

In this case, the individual partial methods can be distributed to different control devices. A connection of non-safety-relevant consumers 17.*m* in other power distributors 50, 52 can also take place.

The connection of the non-safety-relevant consumers 17.*m* is carried out according to the state at the safety-relevant consumers 16.*n*. The non-safety-relevant consumers 17.*m* are selected on the basis of the resistance between the power distributor 18 and the power source (DC voltage converter 22, energy store 12) as well as the internal resistance Ri of the energy store 12. Non-safety-relevant consumers 17.*m* are specifically connected using a pre-calculation according to one of the steps described above.

For example, in one variant, a reconnection attempt could take place after a defined time. For example, if after x seconds, a reconnection attempt was unsuccessful, i.e., a disconnection took place again, k attempts to reconnect again may be performed, for example. Alternatively, an error message may be transmitted. The reconnection attempts may be set.

As a further alternative criterion, it is ascertained whether the voltage U is stable for a defined time. For example, if the voltage U is greater than a threshold value Ug of, for example 11V for x seconds, the disconnected non-safety-relevant consumers 17.*m* can subsequently be connected.

The function described is not limited to a particular voltage level U in the on-board power system, e.g., 12 V in the exemplary embodiment. The method described has an interface (not shown) to the energy management in order to transmit at least one piece of feedback information about the disconnected non-safety-relevant consumers 17.*m*. Additionally, communication or specification from a superordinate vehicle system (e.g., energy management as described in the associated partial methods) is possible. Due to the required execution speed (between 1 ms and 500 ms), the energy management cannot itself carry out the function. The specification parameters must therefore be provided in the power distributor 18 prior to the function being carried out, or exclusively upon re-connection after an undervoltage has occurred. In rare cases, a disconnection of a safety-relevant consumer 16.*n* may also be necessary. The connection described is also suitable for connecting a disconnected safety-relevant consumer 16.*n*.

What is claimed is:

1. A method for monitoring an on-board power supply of a motor vehicle, the motor vehicle including at least one power distributor via which a supply voltage is supplied to at least one safety-relevant consumer and via which non-safety-relevant consumers are supplied, wherein the power distributor is supplied by at least one energy store, the method comprising:
    disconnecting the non-safety-relevant consumers when at least one measure of the voltage applied at least to the safety-relevant consumer reaches a limit value;
    after disconnecting the non-safety-relevant consumers, ascertaining a measure of the voltage applied at least to the safety-relevant consumer;
    comparing the measure of the voltage applied to the safety-relevant consumer to a further limit value for a sufficient voltage;
    selecting, from the disconnected non-safety-relevant consumers, at least one consumer to be connected, which is connected when the further limit value is respectively reached at the safety-relevant consumer, wherein the consumer to be connected is selected a function of a connection measure such that the connection measure is not exceeded.

2. The method according to claim 1, wherein a demand prediction for ascertaining a respective predicted current demand of each respective consumer of the disconnected non-safety-relevant consumers takes place in order to select the consumer to be connected.

3. The method according to claim 2, wherein the consumers to be connected are selected such that the respective predicted demands of the consumers to be connected do not in total exceed the connection measure.

4. The method according to claim 2, wherein the predicted current demand is ascertained using a previously stored constant value and/or using an actual demand of the disconnected consumer prior to the disconnection and/or using a model for predicting the demand of the respective consumer.

5. The method according to claim 2, wherein the consumer is connected as a function of an amount of the predicted current demand such that the consumer with a highest predicted current demand is connected first.

6. The method according to claim 2, where the disconnected non-safety-relevant consumers are prioritized differently and are connected as a function of the prioritization.

7. The method according to claim 2, wherein the respective predicted current demands of the disconnected non-safety-relevant consumers are assessed with a weighting factor and the consumer is selected according to the assessment.

8. The method according to claim 1, wherein the connection measure is formed as a function of the measure of the voltage applied to the safety-relevant consumer after the disconnection the non-safety-relevant consumers and as a function of the further limit value.

9. The method according to claim 1, wherein a minimum is ascertained from the measure of the voltage applied to the safety-relevant consumer, and a differential voltage is ascertained from a difference of the further limit value and the minimum, and the connection measure is ascertained from the differential voltage.

10. The method according to claim 9, wherein: (i) the connection measure is ascertained as a function of the differential voltage, and/or (ii) the connection measure is ascertained as a function of a resistance of a line path connecting the energy store and the power distributor, and/or (iii) the connection measure is ascertained as a function of an internal resistance of the energy store and/or as a function of a resistance of a line path to a further energy source, and/or (iv) the connection measure is ascertained as a function of a resistance, ascertained by a model or diagnosis, of a line path to the energy store and/or to an alternative power source, and/or (v) the connection measure is ascertained as a function of an internal resistance, ascertained by a model or diagnosis, of the energy store, and/or (vi) the connection measure is transmitted by a further control device for energy management.

11. The method according to claim 1, wherein the non-safety-relevant consumers are each provided with a weighting or priority value and the selection of the consumer to be connected takes place using an optimization of linked weightings or priority values.

12. The method according to claim 1, wherein a trigger for a connection of the consumer to be connected is generated when all voltages at the safety-relevant consumers reach the further limit value.

13. The method according to claim 1, wherein the consumer to be connected is connected after a particular time period and/or after a particular number of triggers.

14. The method according to claim 1, wherein the measure of the voltage applied at least to the safety-relevant consumer is ascertained by measuring the voltage at the safety-relevant consumer and/or using a current flowing through the safety-relevant consumer and/or by measuring the supply voltage and/or by taking into account a worst-case value of the resistance or a resistance estimated by a model, of a line path between the power distributor and the safety-relevant consumer and/or as a function of a worst-case value of a voltage drop at a resistance of a line path between the power distributor and the safety-relevant consumer.

* * * * *